Jan. 14, 1969 L. JULIE 3,422,368

THREE-TERMINAL AMPLIFYING CIRCUIT

Filed Nov. 22, 1965

INVENTOR
LOEBE JULIE

BY
M. J. Rackman
ATTORNEY

United States Patent Office 3,422,368
Patented Jan. 14, 1969

3,422,368

THREE-TERMINAL AMPLIFYING CIRCUIT

Loebe Julie, New York, N.Y., assignor to Julie Research Laboratories, Inc., New York, N.Y., a corporation of New York Filed Nov. 22, 1965, Ser. No. 509,024
U.S. Cl. 330—118 10 Claims
Int. Cl. H03f *3/28;* H01h *7/14*

ABSTRACT OF THE DISCLOSURE

A three-terminal amplifying circuit includes first and second amplifying devices, such as triode tubes. The first amplifying device is in series with a voltage source, a control element and a load device. The second amplifying device is in series with the load device and a second voltage source. The specific circuit configuration provides a three-terminal amplifying circuit having low amplitude distortion, power loss and phase shift.

This invention relates to amplifier systems, and more particularly to output circuits for use therein.

There are many types of amplifier systems in use in present-day technology. Each offers an advantage or combination of advantages for a particular application. The present invention has many of the characteristics of the prior art "push-pull" amplifier, and can be best appreciated if this prior art circuit is first considered. The push-pull circuit includes a transformer-coupled input (or an inverting amplifier in the input circuit). The two tubes (or transistors) in the circuit feed into opposite ends of the primary winding of an output transformer, the output being taken across the transformer secondary winding. The arrangement allows all even harmonics in the output to be balanced out, and consequently more output per tube may be obtained for a given amount of distortion. Another advantage of the arrangement is that one end of the input transformer primary winding and one end of the output transformer secondary winding may be tied together to give an over-all three-terminal configuration. Still another advantage of the circuit is that in the quiescent condition that is no direct current in the output transformer secondary winding, i.e., there is no quiescent current through the load.

There are two main disadvantages of the prior art push-pull amplifier. First, an output transformer must be used. This transformer not only is costly, but more important by itself often introduces serious distortion in the output signal. Second, an input transformer or an inverting amplifier must be used to feed the input signal into the two tubes used in the amplifier. The input transformer aggravates the problems presented by the output transformer, and the alternative inverting amplifier requires the use of a third active device.

It is an object of this invention to provide an amplifier circuit having a three-terminal configuration in which amplitude distortion, frequency response limitations, power loss and phase shift is kept to a minimum.

It is another object of this invention to provide an amplifier circuit having neither an output transformer nor a coupling capacitor, yet which has no quiescent current through the load circuit.

It is another object of this invention to provide a bipolar amplifier circuit having push-pull characteristics without the use of an input transformer or an additional inverting amplifier.

It is still another object of this invention to provide a wide band amplifier circuit wherein the frequency response extends down to zero frequency or DC.

In the basic prior art push-pull circuit two tubes are provided with their cathodes tied together. The two plates are connected to opposite ends of an output transformer primary winding, the center tap of this winding being connected to a plate supply. Although a single input signal is operated upon, through the use of an input transformer or an inverting amplifier opposite polarity input signals are applied to the grids of the two tubes. The resulting even harmonics in the output currents in the output transformer primary winding cancel each other out, thereby greatly reducing the distortion in the output signal appearing across the output transformer secondary winding. The use of an output transformer, of course, insures that there is no direct current component in the output signal. And by tying together the input and output transformer windings a three-terminal configuration is obtained. This latter characteristic may be very important where great stability is required and feedback is provided between the output and input circuits. Since both include a common reference ground terminal the magnitudes of the input and output signals may be compared accurately.

In the illustrative embodiment of the invention, the input signal is applied to the grid of only one tube, thus eliminating the need for an input transformer or an inverting amplifier. The plate of this tube is connected through a plate supply to one end of the load, without the use of an output transformer. In the plate circuit of the first tube is an additional element such as a resistor. The voltage signal developed across this resistor, the polarity of the signal being opposite to that of the input signal, is used to drive the grid of the second tube. The plate of this second tube is connected through a second plate supply to the other end of the load. This connection of the two tubes to the load allows the quiescent tube currents through the load to cancel out, thus providing an output signal having no direct current component, yet without the use of an output transformer or a coupling capacitor. Because the tube currents pass through the load as the tube currents of a push-pull circuit pass through an output transformer primary winding, second harmonics cancel out and the signal distortion is reduced. One end of the load also serves as one of the input terminals, thus providing a three-terminal amplifier configuration.

It is a feature of this invention to provide two individual amplifying circuits which feed currents into a load circuit in opposite directions.

It is another feature of this invention to apply an input signal to one of the amplifying circuits.

It is still another feature of this invention to include a device in the first amplifying circuit for deriving a signal dependent on the current in the first amplifying circuit, and to apply the derived signal to the second of the amplifying circuits.

Further objects, features and advantages of the invention will become apparent upon consideration of the following detailed description in conjunction with the drawing in which.

Figure 1:
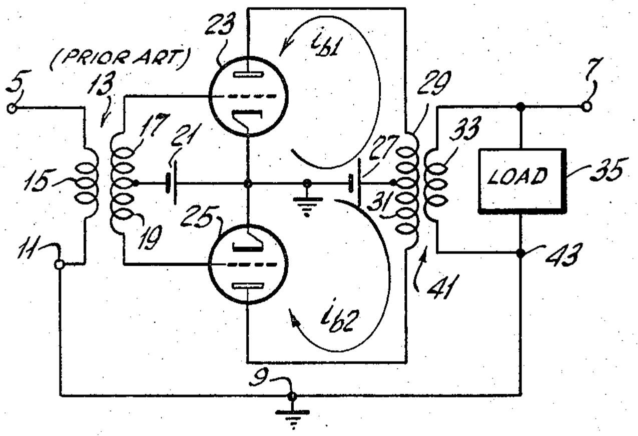
FIG. 1 is a schematic diagram of a prior art push-pull amplifier circuit.

Referring to the prior art push-pull amplifier circuit of FIG. 1, it is seen that the input signal is applied across primary winding 15 of transformer 13 between terminals 5 and 11. The cathodes of tubes 23 and 25 are both connected through bias source 21 to the center tap of the secondary winding of the input transformer. The input signals to the two tubes appear across respective windings 17 and 19. The grid-to-cathode input signals for the two tubes are opposite in polarity. It is essential in the push-pull circuit that these opposite polarity signals be derived. An alternative to the input transformer is the use of an inverting amplifier. The input signal may be applied directly to the grid of one tube, and through the inverter to the grid of the other. While this latter alternative does not require the use of an input transformer, it does require the inclusion of at least a third active device in the over-all circuit.

The plates of the two tubes are connected to the two halves of the primary winding, 29 and 31, of the output transformer 41. The center tap of this transformer primary winding is connected through plate supply 27 to the grounded cathode terminals. The output signal appears across secondary winding 33 and load 35. The output terminals of the device are terminals 7 and 43. Terminals 11 and 43 may be connected together and grounded at terminal 9. This connection produces a three-terminal configuration. The input signal appears between terminal 5 and grounded reference terminal 9, and the output signal appears between terminal 7 and the same reference point.

The quiescent currents through the tubes are in the direction shown in the drawing. If these currents are made equal, the net current through the primary winding of the output transformer is zero, the transformer core does not saturate, and the transformer characteristic is more linear. One of the primary advantages of the circuit is that while the two tubes are not perfectly linear elements, the major source of signal distortion is eliminated. Assume that the grid-to-cathode signal voltage of tube 23 is of the form $E_{gk}$ cos $wt$. Due to the non-linearity of tube 23, it can be shown that the signal current through tube 23 is of the form $i_{b1}=I_b+B_0+B_1 \cos wt+B \cos 2wt+B_3 \cos 3wt+ \ldots$, where $I_b$ is the quiescent current, $B_0$ is a direct current component produced by the tube non-linearity, $B_1$ cost $wt$ is the desired signal current, and the subsequent terms are undesired harmonics. Since the input signal to tube 25 is opposite in polarity to the input signal to tube 23, i.e., it is of the form $E_{gk}$ cost $(wt+\pi)$, the output current for tube 25 is obtained by replacing $wt$ by $(wt+\pi)$ in the expression for $i_{b1}$. That is, $$i_{b2}=I_b+B_0+B_1 \cos (wt+\pi)+B_2 \cos 2(wt+\pi)+ \ldots,$$

which is $$i_{b2}=I_b+B_0-B_1 \cos wt+B_2 \cos 2wt-B_3 \cos 3wt+ \ldots.$$

The two signal currents are in opposite directions through the primary winding of the output transformer. Consequently, the total output current through load 35 is proportional to the difference between the plate currents in the two tubes. That is, $$i=k(i_{b1}-k(i_{b2})=2k(B_2 \cos wt+B_3 \cos 3wt+ \ldots)$$

Thus the push-pull circuit balances out all even harmonics in the output and leaves the third harmonic term as the major source of distortion. Since it is the second harmonic which introduces the most distortion, it is seen that if identical tubes are used the net distortion in the output signal is minimized. This is true even if the circuit is operated in Class B or Class AB.

One of the main disadvantages of the prior art circuit of FIG. 1 is that the output transformer, in addition to its size, weight and cost, introduces amplitude distortion, frequency response limitations at low and high frequencies, power loss than phase shifts, which may be a serious form of distortion in themselves. The output transformer may be eliminated by resorting to one of two alternatives. The first is to connect the load directly across the plates of the two tubes in place of the primary winding of the output transformer. The total quiescent current through the load will be zero just as the total quiescent current through the primary winding of the output transformer in FIG. 1 is zero. The difficulty with this arrangement is two-fold. First, the load must have a center tap for connection to the plate supply 27. Most loads do not have such a center tap. Second, neither end of the load may be connected to terminal 9 and grounded to provide a three-terminal configuration. The second alternative is to connect both plates to one end of the load and the other end of the load to the plate supply 27. In such a case, however, the quiescent current through the load is not zero.

Thus, in a prior art push-pull circuit an output transformer must be used if the circuit is to exhibit a three-terminal configuration and no quiescent current is to flow through the load. The output transformer adds to the cost of the systetm, and more important may introduce serious distortions in the output signal. At the input, another transformer must be used or an alternative inverting amplifier, neither of which is desirable. While the prior art has been analyzed with reference to a push-pull circuit, it must be understood that there are other amplifier circuits which offer similar advantages, such as the elimination of even harmonics in the output signal Nevertheless, there are no prior art circuits which exhibit a three-terminal configuration, no quiescent load current, and no second harmonic (the worst of all) in the output signal, together with the absence of an output transformer and an input circuit including neither a transformer nor an inverting amplifier.

Figure 2:
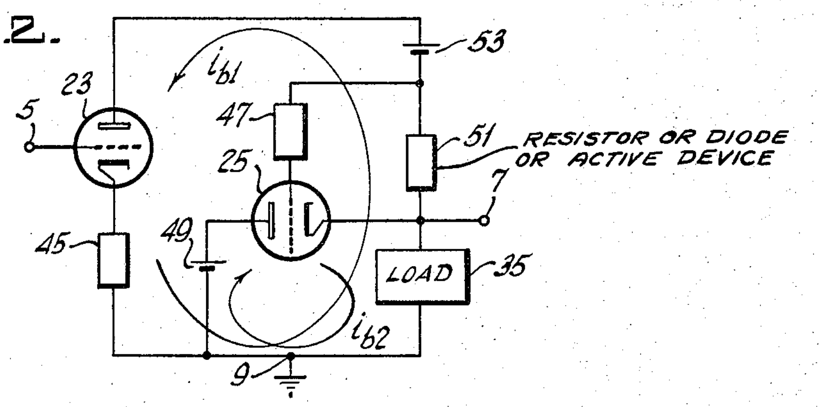
FIG. 2 is a schematic diagram of an illustrative embodiment of the invention.

The illustrative embodiment of my invention, shown in FIG. 2, is a three-terminal conguration, the input appearing between terminal 5 and grounded terminal 9, and the output across load 35 appearing between output terminal 7 and the same reference point. The circuit includes neither a transformer nor an inverting amplifier at its input, and does not require an output transformer. Nevertheless, it will be shown that the quiescent current through the load 35 may be made zero if desired, and the distortion of the output signal is minimized because of the cancellation of second harmonics. It should be noted that these advantages are achieved even though the load 35 is a two-terminal device without a center tap.

The input signal is applied between terminals 5 and 9. The plate circuit for tube 23 includes plate supply 53, element 51, load 35, and bias network 45. The latter network serves to bias tube 23 and may be one of many standard circuits. In its simplest form, circuit 45 is merely a resistor. Element 51 may be one of a variety of devices, as will be described below. The simplest one of these devices, however, is a resistor, and in the following analysis it will be assumed that element 51 is a resistor.

The second tube circuit in the amplifier is the simple combination of tube 25 and plate supply 49, which are placed across load 35. Thus, both tube circuits feed current into the same load. The grid bias for tube 25 is provided by element 47 which may be a resistor, battery, or even a short circuit. If tube 25 is a screen grid tube rather than an ordinary triode, the tube may be biased in the positive direction. In such a case, element 47 is preferably a resistor, with an additional dropping resistor being connected between the screen grid and a screen supply. (Tube 23 may also be a screen grid tube, both active devices may be transistors, etc.) As shown in FIG. 2, while element 47 provides the grid bias for tube 25, the input signal applied to the grid of this tube is the voltage developed across resistor 51, which voltage is in turn proportional to the signal current $i_{b1}$ through tube 23.

It will now be shown that the arrangement of FIG. 2 eliminates quiescent current through load 35, provides balanced, reinforcing signal currents through the load, and eliminates second harmonic distortions in the output signal. Consider first the elimination of quiescent current through load 35. Depending on the magnitude of plate supply 53, and the total resistance of elements 51, 35 and 45, the operating point of tube 23 may be determined from the tube characteristics. This in turn allows the quiescent current, flowing in the direction shown for $i_{b1}$, to be determined. The operating point for the second tube 25 may be controlled by adjusting bias network 47 and/or coupling element 51 or the magnitude of plate supply 49. A quiescent point is selected such that the quiescent current through tube 25, flowing in the direction shown for $i_{b2}$, is the same as the quiescent current flowing through tube 23. Since the two quiescent currents flow in opposite directions through load 35, the net quiescent current through the load is zero.

Consider next the operation of the circuit in the ideal case where both tubes are linear, and the magnitude of resistor 51 required for proper operation. For a given input signal, a signal current $i_{b1}$ flows in the direction shown through load 35, resistor 51, and tube 23. A resistor 51 must be chosen such that an equal but opposite polarity current $i_{b2}$ flows through tube 25 in order that the two currents reinforce each other in load 35. (This effect is similar to that in the push-pull operation.) The signal voltage across resistor 51 is $(i_{b1})(R_{51})$ where $R_{51}$ is the magnitude of resistor 51. This voltage is negative between the grid and cathode terminals of tube 25. Consequently the actual current flow $i_{b2}$ is in the direction opposite to that shown in FIG. 2, and the two tube currents reinforce each other in the load. Assume that the effective mutual conductance of tube 25 is $g'_m$. The magnitude of current $i_{b2}$ is thus $(i_{b1})(R_{51})(g'_m)$, and since the magnitudes of $i_{b1}$ and $i_{b2}$ are equal, the product $(R_{51})(g'_m)$ must be unity. Consequently $R_{51}$ must equal $1/g'_m$.

The value of $g'_m$ must be known in order that the proper resistor 51 may be selected. For a simple prior art amplifier circuit having a load $R_L$, the effective mutual conductance $g'_m$ is $\mu/(r_p+R_L)$ where $\mu$ is the amplification factor of the tube and $r_p$ is the plate resistance. In the circuit of FIG. 2, it must be noted that the total current through load 35 is not merely the plate current of tube 25 but rather twice this value since currents $i_{b1}$ and $i_{b2}$ are equal and reinforcing. Consequently, tube 25 sees an effective load which is equal to twice the magnitude of the load impedance. Thus, the effective mutual conductance $g'_m$ of tube 25 is $\mu/(r_p+2R_L)$. Since $\mu$ and $r_p$ may be determined once the operating point for tube 25 is known, and since the magnitude of the load 35 is known for any particular application, the value of the effective mutual conductance $g'_m$ may be determined. The magnitude of the resistor 51 which is included in the circuit is $1/g'_m$.

The above analysis shows how the two tube signal currents reinforce each other in the load. What must yet be analyzed is the manner in which the second harmonics in the tube currents may be cancelled, thus eliminating the major source of distortion in the output signal. While the quantitative analysis is complex, the over-all effect may be understood from a qualitative point of view. As in the push-pull amplifier circuit, second harmonics are introduced in the tube currents only because the tubes are not perfectly linear. Also, as in the push-pull circuit, since the polarity of the input signal to tube 25 is opposite to the polarity of the input signal to tube 23, while the desired signal currents reinforce each other through the load, the second harmonics oppose each other. For the purpose of analysis, it will be assumed that for a given input signal of a single frequency tube 23 produces a desired plate signal current $I_1$ and a second harmonic $I_{H1}$. Although other harmonics appear in the current signal $i_{b1}$, since the major source of distortion is the second harmonic for a qualitative analysis, it is sufficient to consider only this one undesired current component. The next step in the analysis is to assume that tube 25 operates as an ideal linear device. The signal voltage for this tube is proportional to the sum of $I_1$ and $I_{H1}$. Since it is desired that tube 25 also produce a signal current $I_1$ in order that the two major signal currents reinforce each other through the load, the plate current of tube 25 is made equal to $I_1$ plus $I_{H1}$. It must be remembered that it is now assumed that tube 25 is perfectly linear and that it faithfully reproduces the signal current of tube 23. While it was mentioned above that the second harmonics developed by the two tubes oppose each other through the load, it must be realized that at this stage no consideration is being made of a second harmonic developed by the non-linearity of tube 25. Tube 25, if perfectly linear, faithfully reproduces the signal current of the first tube, the two tube signal currents both passing through the load in the same direction. Consequently, the total load current is $2I_1+2I_{H1}$.

The object of the circuit, of course, is to eliminate second harmonics from the output signal and thus far the output signal appears to be a reinforced second harmonic. This is true, however, only because thus far it has been assumed that tube 25 is linear. The effects of its practical, non-linear characteristics must now be considered. The input signal to the second tube is proportional to the sum of $I_1$ and $I_{H1}$. Because of the non-linearity of the tube, the $I_1$ component in the input signal results in an $I_1$ component in the tube output current and a second harmonic. This second harmonic is in opposition to the second harmonics considered above which appear in the load current because, as described above, the second harmonic produced by tube 25 is in a direction opposite to that produced by tube 23 (and reinforced by the "linear" operation of tube 25) through the load. Tube 25 may be operated in a region which is more non-linear than the region in which tube 23 is operated. More specifically, assume that the second harmonic produced by tube 25 for any input signal has a magnitude which is twice the magnitude of the second harmonic produced by tube 23 In such a case, the second harmonic introduced by the non-linearity of tube 25 cancels the $2I_{H1}$ component of the total load current. Consequently, there is no second harmonic in the load current.

The effect of the initial second harmonic in the input signal to tube 25 must still be considered since thus far the non-linear operation of tube 25 has been considered only with reference to the $I_1$ component in the $i_{b1}$ signal. The second harmonic component in the input signal across resistor 51, due to the non-linearity of tube 25, results in an harmonic of twice the second harmonic signal frequency, i.e., a fourth harmonic. Consequently, while in the push-pull circuit all even harmonics are canceled out, in the circuit of FIG. 2 only the second harmonics are canceled out and a fourth harmonic does appear in the output signal. The magnitude of this fourth harmonic, however, in almost all cases is negligible and need not be of concern. The advantages of the circuit more than outweigh the presence of this fourth harmonic.

The objectives of the circuit of FIG. 2, insofar as the above discussion is concerned, are threefold: (a) the tube quiescent currents must be equal, (b) the $I_1$ signal currents of the two tubes must be equal, and (c) the non-linearity of tube 25 as compared with that of tube 23 must be such that the second harmonic produced by tube 25 for any input signal must be twice as great as that produced by tube 23. All of these characteristics may be obtained together. The operating point of tube 23 is first determined. This operating point depends on the magnitude of resistor 51, but since in a typical application the magnitude of the load (plus the magnitude of any resistance in bias network 45) is so much greater than the magnitude of resistor 51, resistor 51 may be disregarded in selecting the operating point for tube 23. The next step is to choose an operating point for tube 25 which has the same value of quiescent current but which is in a sufficiently non-linear portion of the tube characteristic such that the second harmonic in the output signal of tube 25 is twice that in the output signal of tube 23. Once the operating point is selected, a plate supply 49 and a bias network 47 are chosen such that the load line for tube 25 passes through the predetermined operating point. Finally, the magnitude of resistor 51 is selected in accordance with the value of $\mu$ and $r_p$ of tube 25 at the selected operating point and in accordance with the magnitude of the load, i.e., the magnitude of resistor 51 is the inverse of $g'_m$.

The above analysis pertains to a Class A operation. The tubes, however, may also be operated in Class AB, as may the prior art push-pull circuit, and the same advantages result.

In the above analysis it has been assumed that element 51 is a resistor. It is possible to use a forward-biased diode or even an active device such an another tube for element 51. It is also possible to use a non-linear device for element 51. In such a case, the non-linearity of element 51 may aid the non-linearity of tube 25 in the elimination of distortion in the output signal.

It is possible that individual tubes such as 23 and 25 may not be sufficient if the circuit is to handle large currents. As is known in the art, it is possible to parallel tubes to obtain greater currents. In such a case, each of tubes 23 and 25 would be replaced by a group of parallel tubes, whose plates are tied together. The cathodes are advantageously not tied together (in order that one tube not "rob" more than its share of the current), but rather are connected to respective resistors, the others ends of these resistors being connected together.

If transistors are used instead of tubes, the problem which will more likely be encountered is that the individual transistors may not be capable of providing a sufficient voltage swing if the circuit is to handle large voltages. In such a case, each active device 23 and 25 may be replaced by a group of transistors connected in series. In a typical prior art configuration, the emitter of each transistor is connected to the collector of the succeeding transistor and a resistor is connected between the bases of adjacent transistors. The Collector of the last transistor in the series is connected to the supply voltage and the base of this transistor is connected to the collector through a resistor. The input signal is applied between the base and the emitter terminals of the first transistor in the series, and the base of the second transistor in the series is connected through a resistor not to the base of the first transistor but rather to the emitter of the first transistor. Two of these prior art circuits may be used to obtain the required voltage swing.

The circuit of FIG. 2 offers numerous advantages. There is no quiescent current through the two-terminal load, and neither an input nor an output transformer is required. The amplifier circuit is wide band in that it amplifies signals in a range from high frequency all the way down to DC. Furthermore, the circuit is bi-polar. If a small negative input signal is applied between terminal 5 and grounded terminal 9, a large postive signal appears across load 35 between terminals 7 and 9. If the input signal is positive, a large negative signal is developed across the load.

In the three-terminal embodiment of FIG. 2, the circuit provides both current and voltage amplification. The circuit, however, is suitable for other applications. For example, if terminal 7 is grounded instead of terminal 9 the circuit has a voltage gain of approximately unity (the over-all configuration is similar to that of a cathode follower), but exhibits a high current gain. On the other hand, suppose that terminal 5 is grounded instead of terminal 9 and an input signal is applied to terminal 9. In such a case, the system exhibits unity current gain between terminals 9 and 7 together with a large voltage gain.

Figure 3:
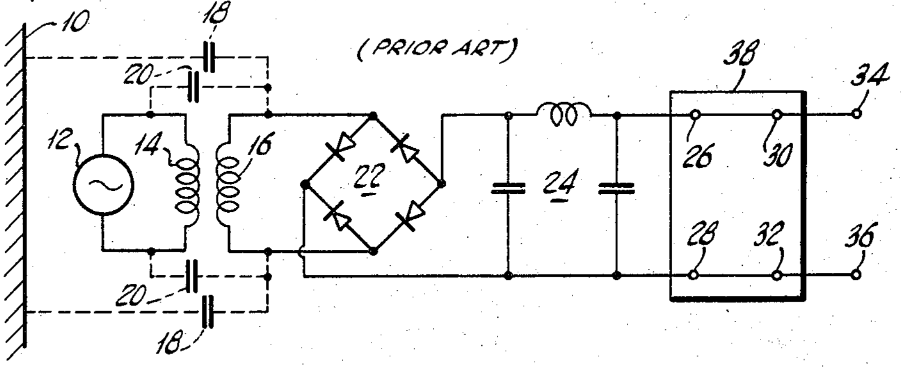
FIG. 3 is a schematic diagram of a prior art plate supply.

One problem may arise in the circuit of FIG. 2 which is not encountered in conventional amplifier circuits. In a typical prior art amplifier circuit the plate of the tube is connected to one end of the load, the other end of the load being connected through a plate supply to ground. The plate supply ideally exhibits a zero AC impedance. Due to various stray capacitances the two output terminals of the supply may shunt AC signals to ground. This is of no moment in the ordinary amplifier circuit, however, because that end of the load connected to the supply ideally is connected to ground as far as AC signals are concerned. This is because the negative end of the supply is grounded and the supply itself exhibits no AC impedance. However, if reference is made to FIG. 2, it is seen that the plate supply 53 for tube 23 does not have its negative terminal grounded. Consider the effect of stray capacitances from either terminal of the supply to ground. If this stray capacitance is appreciable, signal currents through tube 23 are shorted through the stray capacitance to ground. The stray capacitance of the supply 53 in the illustrative embodiment of the invention may be of great concern because if it is appreciable the signal current from tube 23 is shorted directly to ground rather than flowing through element 51 and load 53. This is especially true at high frequencies when the impedance of the stray capacitance may be very small. For this reason, it may be necessary to use a plate supply 53 which exhibits little stray capacitance at its terminals. FIG. 3 shows a typical prior art plate supply with exhibits stray capacitances from its two terminals 34 and 36 to ground. If the circuit of FIG. 4 is added to the circuit of FIG. 3 between terminals 26, 28, 30 and 32 in box 38, the stray capacitance effect may be eliminated.

Consider first the basic circuit of FIG. 3. A typical power supply consists of AC source 12 connected across primary winding 14 of a transformer. Secondary winding 16 is connected to the full-wave rectifier 22. The rectifier is in turn connected to filter 24 and a DC voltage appears between terminals 26 and 28. These terminals are connected directly to respective output terminals 34 and 36.

The major source of stray capacitance is that existing between the two windings of the transformer, represented by capacitances 20, and the two stray capacitances, represented by capacitances 18, between the secondary winding and the grounded frame 10. These capacitances are reflected through the supply to the output terminals and, in effect, result in a capacitance between each of the output terminals and ground. The stray capacitances are usually minimized by careful construction of the transformer windings but cannot be completely eliminated. The effective or equivalent stray capacitance at the two output terminals of the supply, while of no moment in the typical prior art amplifier circuit, may present a serious problem in the circuit of FIG. 2 for the reasons described above.

Figure 4:
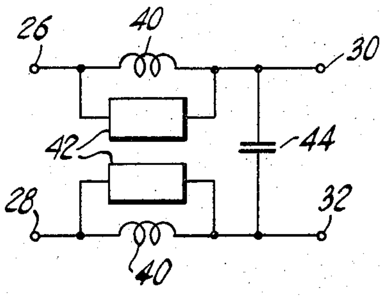
FIG. 4 is a schematic diagram of an improvement for the prior art plate supply of FIG. 3.

This problem may be obviated if the circuit of FIG. 4 is included in box 38 of FIG. 3. The circuit consists primarily of a capacitor 44, two inductors 40 and two filters 42. These components do not affect the basic operation of the supply since the two inductors allow direct current to flow and capacitance 44 blocks it in order that the direct current supplied by the supply flow in the tube circuit. Since the inductors present an appreciable impedance to AC signals, capacitance 44 is provided in order that the supply exhibit a negligible impedance to AC signals between its two terminals. Capacitance 44 is included in the circuit in order that inductors 40 not affect the AC operation. It is the inductors which eliminate the stray capacitance. It will be recalled that the stray capacitance at the output terminals 30 and 32 arise from the stray capacitances 18 and 20 associated with the transformer windings. If two inductors 40 are included in box 38, looking into the supply, these inductors are seen before the reflected stray capacitances. Since the inductors present a high impedance to AC signals, the stray capacitances of the transformer windings are not reflected to the output terminals.

The problem, however, may not be completely solved merely with the inclusion of inductors 40. With these inductors in the circuit, the AC impedance of source 53 in FIG. 2, which shorts the plate of tube 23 to ground, is an equivalent inductor and capacitance connected in series. As described above, the inductor presents a high impedance to AC signals and thus the shorting effect of the equivalent capacitance is eliminated. However, a series connection of an inductor and a capacitor has a resonant frequency (whose value depends on the component magnitudes) which presents a total zero impedance to signals of this frequency. If the frequency range over which the amplifier of FIG. 2 is to operate includes this resonant frequency all signals of this particular frequency will be shorted through the supply to ground. Similar remarks apply to the frequencies close to and on either side of the resonant frequency. To eliminate this shorting effect, filters 42 are introduced. These filters, of which there are many known types in the prior art for serving the designed purpose, insure that the impedance of the equivalent serially connected inductor and capacitor is appreciable for the frequency at which the inductor and the capacitance would otherwise resonate. In many cases, conventional plate supplies will be sufficient for use in the circuit of FIG. 2, but in the event the stray capacitance of the supply affects the proper operation of the amplifier, the circuit of FIG. 4 may be added to the supply to eliminate this effect.

Although the invention has been described with reference to a particular embodiment, it is to be understood that this embodiment is only illustrative of the application of the principles of the invention. Numerous modifications may be made therein and other arrangements may be devised without departing from the spirit and scope of the invention.

What is claimed is:

1. An amplifier circuit having no more than three terminals and comprising first and second amplifying devices, said amplifying devices each having first, second and third terminals, the second terminals controlling the impedance across the amplifying devices, a first input terminal connected to the second terminal of said first amplifying device to supply an input signal, a first output terminal connected to the first terminal of said second amplifying device, a load device, and a first voltage source connected in series between the first and third terminals of said second amplifying device, a second voltage source connected to the third terminal of said first amplifying device, controlling means connected to said second voltage source and to said load device for developing a voltage dependent upon the current flowing through said first amplifying device, means connected to said controlling means to couple the developed signal voltage to the second terminal of said second amplifying device, bias means connecting the first terminal of said first amplifying device to the first voltage source, and a second input terminal between said load device and said first voltage source in common with a second output terminal.

2. An amplifier circuit in accordance with claim 1 wherein said signal voltage developing means is a resistor.

3. An amplifier circuit in accordance with claim 1 wherein said signal voltage developing means is a diode.

4. An amplifier circuit in accordance with claim 1 wherein said signal voltage developing means is an active device.

5. An amplifier circuit in accordance with claim 1 wherein said signal voltage developing means is a nonlinear device.

6. An amplifier circuit in accordance with claim 1 wherein said first and second amplifying devices are connected to said load device such that opposite polarity quiescent current flow through said load device.

7. An amplifier circuit in accordance with claim 6 further including means for applying an input signal to said first amplifying device, and wherein said controlling means is arranged to apply an opposite polarity input signal to said second amplifying device.

8. An amplifier circuit in accordance with claim 7 wherein said second amplifying device is operated at a quiescent point such that said second amplifying device supplies a component of signal current to said load device which opposes an undesirable component of signal current supplied to said load device by said first amplifying device.

9. An amplifier circuit in accordance with claim 1 wherein at least one of said voltage sources includes a two-terminal source of direct current potential, two inductors each connected to one of said two terminals, and a capacitor connected between said two inductors and further including two filters each connected across a respective one of said two inductors.

10. A voltage source comprising a source of alternating current, a transformer having primary and secondary windings, said primary winding being connected to said alternating source, a rectifier connected to said secondary winding, a filter connected to said rectifier, said filter having first and second output terminals, first and second inductors each connected at one end thereof to a respective one of said filter output terminals, and an output capacitor connected between the other ends of said inductors and further including two filters each connected across a respective one of said first and second inductors.

References Cited

UNITED STATES PATENTS

| | | | |
|---|---|---|---|
| 1,824,819 | 9/1931 | Houck | 333—79 |
| 2,016,303 | 10/1935 | Sprague | 333—79 |
| 2,579,528 | 12/1951 | Williams | 330—123 X |
| 3,046,489 | 7/1962 | Reaves et al. | 330—199 |

ROY LAKE, *Primary Examiner.*

J. B. MULLINS, *Assistant Examiner.*

U.S. Cl. X.R.

330—123, 200; 333—79